United States Patent
De et al.

(10) Patent No.: US 6,924,339 B2
(45) Date of Patent: Aug. 2, 2005

(54) THERMALLY CURED UNDERLAYER FOR LITHOGRAPHIC APPLICATION

(75) Inventors: Binod B. De, Providence, RI (US); Sanjay Malik, Attleboro, MA (US); Gregory Spaziano, Providence, RI (US); John Joseph Biafore, Providence, RI (US); Patrick Foster, Franklin, MA (US); Sidney George Slater, Poughquag, NY (US); Thomas Steinhausler, Collierville, TN (US); Andrew J. Blakeney, Seekonk, MA (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 178 days.

(21) Appl. No.: 10/438,132

(22) Filed: May 14, 2003

(65) Prior Publication Data

US 2003/0204035 A1 Oct. 30, 2003

Related U.S. Application Data

(62) Division of application No. 10/093,079, filed on Mar. 7, 2002, now Pat. No. 6,610,808, which is a continuation-in-part of application No. 09/901,933, filed on Jul. 9, 2001, now Pat. No. 6,783,916, which is a division of application No. 09/268,430, filed on Mar. 12, 1999, now Pat. No. 6,323,287.

(51) Int. Cl.⁷ ............................................. C08F 212/14
(52) U.S. Cl. .................... 525/328.8; 525/374; 525/375; 526/281
(58) Field of Search .............................. 525/328.8, 374, 525/375; 526/281

(56) References Cited

U.S. PATENT DOCUMENTS 4,454,274 A * 6/1984 Singer et al. ................ 524/157
4,874,686 A * 10/1989 Urabe et al. ............. 430/272.1
6,114,085 A * 9/2000 Padmanaban et al. ... 430/270.1
6,165,697 A * 12/2000 Thackeray et al. ......... 430/325
6,323,287 B1 * 11/2001 Foster et al. ............. 525/328.8

FOREIGN PATENT DOCUMENTS

| EP | 0942331 | * | 9/1999 |
| EP | 0987600 | * | 3/2000 |
| EP | 1172695 | * | 1/2002 |

* cited by examiner

Primary Examiner—Bernard Lipman
(74) Attorney, Agent, or Firm—Ohlandt, Greeley, Ruggiero & Perle LLP

(57) ABSTRACT

Thermally cured undercoat for use in lithography of a thermally cured composition comprising a hydroxyl-containing polymer, an amino cross-linking agent and a thermal acid generator, wherein the hydroxyl containing polymer is a polymer comprising units m, n and o of the following formula:

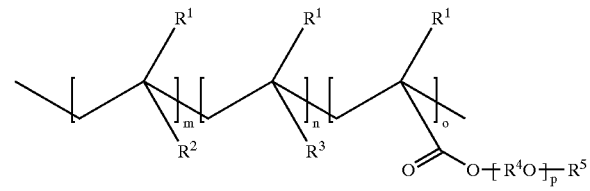

wherein $R^1$ is H or methyl; $R^2$ is a substituted or unsubstituted $C_6-C_{14}$ aryl acrylate or $C_6-C_{14}$ aryl methacrylate group wherein the substituted groups may be phenyl, $C_{1-4}$ alkyl or $C_{1-4}$ alkoxy; $R^3$ is a hydroxyl functionalized $C_1-C_8$ alkyl acrylate, methacrylate or $C_6-C_{14}$ aryl group, $R^4$ is a $C_1-C_{10}$ linear or branched alkylene; p is an integer of from 1 to 5 with the proviso that there are no more than thirty carbon atoms in the $[-R^4O-]_p$; $R^5$ is a $C_1-C_{10}$ linear, branched or cyclic alkyl, substituted or unsubstituted $C_6-C_{14}$ aryl, or substituted or unsubstituted $C_7-C_{15}$ alicyclic hydrocarbon; and m is about 40 to 70, n is about 15 to 35 and o is about 15 to 25.

18 Claims, No Drawings

US 6,924,339 B2

THERMALLY CURED UNDERLAYER FOR LITHOGRAPHIC APPLICATION

RELATED APPLICATION

This is a division, of application Ser. No. 10/093,079, filed Mar. 7, 2002 now U.S. Pat. No. 6,610,808. This application is a continuation-in part of application Ser. No. 09/901,933, filed Jul. 9, 2001 now U.S. Pat. No. 6,783,916, which in turn is a division of application Ser. No. 09/268,430, filed Mar. 12, 1999, now U.S. Pat. No. 6,323,287, issued Nov. 27, 2001.

FIELD OF THE INVENTION

The present invention relates to deep UV lithography used in semiconductor manufacturing and more particularly to undercoat layers for chemically amplified bilayer resist systems.

BACKGROUND TO THE INVENTION

Integrated circuit production relies on the use of photolithographic processes to define the active elements and interconnecting structures on microelectronic devices. Until recently, g-line (436 nm) and l-line (365 nm) wavelengths of light have been used for the bulk of microlithographic applications. However, in order to achieve smaller dimensions of resolution, the wavelength of light used for microlithography in semiconductor manufacturing has been reduced into the deep UV regions of 254 nm and 193 nm. The problem with using deep UV wavelengths is that resists used at the higher wavelengths were too absorbent and insensitive. Thus, in order to utilize deep UV light wavelengths, new resist materials with low optical absorption and enhanced sensitivities were needed.

Chemically amplified resist materials have recently been developed through the use of acid-labile polymers in order to meet the above-mentioned criteria. They have shown great promise in increasing resolution. However, chemically amplified resist systems have many shortcomings. One problem is standing wave effects, which occur when monochromatic is reflected off the surface of a reflective substrate during exposure. The formation of standing waves in the resist reduces resolution and causes linewidth variations. For example, standing waves in a positive resist have a tendency to result in a foot at the resist/substrate interface reducing the resolution of the resist.

In addition, chemically amplified resist profiles and resolution may change due to substrate poisoning. Particularly, this effect occurs when the substrate has a nitride layer. It is believed that residual N—H bonds in the nitride film deactivates the acid at the nitride/resist interface. For a positive resist, this results in an insoluble area, and either resist scumming, or a foot at the resist/substrate interface.

Furthermore, lithographic aspect ratios require the chemically amplified resist layer be thin, e.g., about 0.5 μm or lower, to print sub 0.18 μm features. This in turn requires the resist to have excellent plasma etch resistance such that resist image features can be transferred down into the underlying substrate. However, in order to decrease absorbance of the chemically amplified resist, aromatic groups, such as those in novolaks had to be removed, which in turn decreased the etch resistance.

Utilizing an underlayer or undercoat film that is placed on the substrate before the chemical amplified film is applied can reduce the above-mentioned problems. The undercoat absorbs most of the deep UV light attenuating standing wave effects. In addition, the undercoat prevents deactivation of the acid catalyst at the resist/substrate interface. Furthermore, the undercoat layer can contain some aromatic groups to provide etch resistance.

In the typical bilayer resist process, the undercoat layer is applied on the substrate. The chemically amplified resist is then applied on the undercoat layer, exposed to deep UV light and developed to form images in the chemically amplified resist topcoat. The bilayer resist system is then placed in an oxygen plasma etch environment to etch the undercoat in the areas where the chemically amplified resist has been removed by the development. The chemically amplified resist in a bilayer system typically contains silicon and is thus able to withstand oxygen plasma etching by converting the silicon to silicon dioxide, that then withstands the etch process. After the bottom layer is etched, the resist system can be used for subsequent processing such as non-oxygen plasma etch chemistry that removes the underlying substrate.

Even though the undercoat attenuates standing waves and substrate poisoning, it poses other problems. First, some undercoat layers are soluble to the chemical amplified resist solvent component. If there is intermixing between the top and undercoat layers, the resolution and sensitivity of the top resist layer will be detrimentally affected.

In addition, if there is a large difference in the index of refraction between the chemical amplified resist and the undercoat layer, light will reflect off the undercoat layer causing standing wave effects in the resist. Thus, the real portion "n" of the index of refraction of the two layers must be made to essentially match or to have their differences minimized, and the imaginary portion "k" of the index of refraction of the two layers must be optimized to minimize reflectivity effects.

Another problem with undercoating layers is that they are sometimes too absorbent because of incorporation of aromatic groups. Some semiconductor manufacturing deep UV exposure tools utilize the same wavelength of light to both expose the resist and to align the exposure mask to the layer below the resist. If the undercoat layer is too absorbent, the reflected light needed for alignment is too attenuated to be useful. However, if the undercoat layer is not absorbent enough, standing waves may occur. A formulator must balance these competing objectives.

In addition, some undercoats have very poor plasma etch resistance to plasma chemistry. The etch resistance of the undercoat should be comparable to the etch rate of novolak resins in order to be commercially viable.

Furthermore, some undercoat layers require UV exposure in order to form cross-links before the radiation sensitive resist topcoat layer can be applied. The problem with UV cross-linking undercoat layers is that they require long exposure times to form sufficient cross-links. The long exposure times severely constrain throughput and add to the cost of producing integrated circuits. The UV tools also do not provide uniform exposure so that some areas of the undercoat layer may be cross-linked more than other areas of the undercoat layer. In addition, UV cross-linking exposure tools are very expensive and are not included in most resist coating tools because of expense and space limitations.

Some undercoat layers are cross-linked by heating. However, the problem with these undercoat layers is that they require high curing temperatures and long curing times before the top layer can be applied. In order to be commercially useful, undercoat layers should be curable at temperatures below 250° C. and for a time less than 180 seconds. After curing, the undercoat should have a high glass transition temperature to withstand subsequent high temperature processing and not intermix with the resist layer.

Therefore, it has recently been proposed to utilize thermally cured undercoat layers in deep UV lithography utilizing compositions containing certain hydroxyl-functionalized polymers, thermal acid generating compounds and amine crosslinking agents. The hydroxy-functionalized polymers proposed for use in such thermally cured underlayer compositions have been copolymers of biphenyl methacrylate (BPMA) and 2-hydroxyethyl methacrylate (HEMA), generally employed with a thermal acid generating compound (TAG) such as cyclohexyl tosylate and an amine crosslinking agent.

However, such proposed thermally cured undercoat (TCU) compositions have presented the following issues:

(a) solubility and compatibility of the current generation 248-nm TCU in common edge-bead removing (EBR) solvents such as propylene glycol mono methyl ether acetate (PGMEA), ethyl lactate (EL), ethyl ethoxy propionate (EEP), and the like;

(b) standing waves presumably, due to less than optimum match of optical parameters (n and k) of the undercoat with substrate and imaging layer (IL); and (c) scumming at the TCU/imaging layer (IL) interface.

In the proposed TCU compositions, although optical constants were able to be reasonably matched, standing waves and scumming at the TCU/IL interface could not be totally eliminated. Additionally, while the use of methyl methoxy propionate (MMP) has been proposed as utilizable for solubilizing the TCU polymer and to address edge bead removing characteristics, MMP is not generally acceptable as a lithographic solvent.

SUMMARY OF THE INVENTION

Therefore, it is an object of the present invention to provide an EBR compatible thermally curable polymer that is useful for an undercoat composition and layer thereof which avoids or reduces the aforementioned drawbacks. Another object of this invention is to provide such a thermally curable polymer to provide an undercoat layer which is cured at temperatures less than 250° C. and for a time of less than about 3 minutes. It is a further object of this invention to provide an undercoat layer which is insoluble to the top resist's solvent system, minimizes reflectivity effects, and has an etch rate comparable to novolaks.

Other and further objects, advantages and features of the present invention shall become apparent as described below.

The present invention is directed to an EBR compatible thermally curable polymer composition comprising a novel hydroxyl-containing polymer, an amino cross-linking agent and a thermal acid generator. The thermally curable polymer composition may be dissolved in a solvent and used as an undercoat layer in deep UV lithography.

In addition, the present invention also relates to a photolithographic coated substrate comprising: a substrate, a thermally cured undercoat composition on the substrate, and a radiation-sensitive resist topcoat on the thermally cured undercoat composition. Furthermore, the present invention further relates to a process for using the photolithographic coated substrate for the production of relief structures.

The polymers generally useful in accordance with this invention will have the general formula

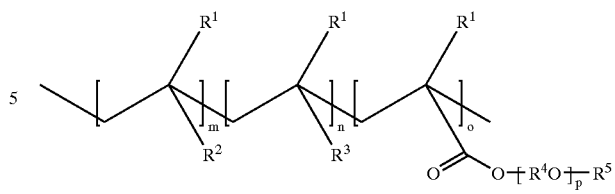

wherein $R^1$ is H or methyl; $R^2$ is the substituted or unsubstituted $C_6-C_{14}$ aryl acrylate or $C_6-C_{14}$ aryl methacrylate group wherein the substituted groups may be phenyl, $C_{1-4}$ alkyl or $C_{1-4}$ alkoxy; $R^3$ is hydroxyl functionalized $C_1-C_8$ alkyl acrylate, methacrylate or $C_6-C_{14}$ aryl group, $R^4$ is a $C_1-C_{10}$ linear or branched alkylene; p is an integer of from 1 to 5 with the proviso that there are no more than thirty carbon atoms in the $[-R^4O-]_p$ grouping; $R^5$ is a $C_1-C_{10}$ linear, branched or cyclic alkyl, substituted or unsubstituted $C_6-C_{14}$ aryl, or substituted or unsubstituted $C_7-C_{15}$ alicyclic hydrocarbon; and m is about 40 to 70, n is about 15 to 35, and o is about 15 to 25. The preferred mole percent ranges are m=60–68, n=15–20 and o=15–20 The aryl groups in the above mentioned definitions are preferably $C_6-C_{10}$ aryl groups, and more preferably phenyl groups. The molecular weight of the polymers of this invention will generally range from about 8,000 to about 100,000, preferably from about 10,000 to about 24,000.

Components m, n and o impart absorption, solubility and crosslinking functions when applied as a TCU material. Each monomeric unit is focused on one of the three functions listed above, but may have some impact on more than one function. This impact is dependent on the specific monomer unit being employed. Changing the amount of monomer represented by m in the formula can vary plasma etch resistance and absorbance, which will strongly vary the optical parameter k, whose influence is on the reflection control of TCU material. The solubility and etch resistance can be optimized by choosing appropriate comonomers n and o. The crosslinking rate is determined by the amount of monomer represented by n in the above formula. Generally, for 248 nm microlithography the optimum range of values for refractive index (n) and complex index (k) are about 1.56 to 1.76 and 0.125 to 0.275 respectively

DETAILED DESCRIPTION AND EMBODIMENTS

In accordance with this invention we obtain such EBR compatible thermally cured polymers by providing monomeric units in the polymer that are designed to modify the solubility/absorbance characteristics. Preferably, such monomeric units are provided in the polymer from the monomers ethyleneglycol dicyclopenteneyl methacrylate (EGDCPMA) in combination with monomeric units of biphenyl methacrylate (BPMA) and hydroxystyrene (HS), that have the following three formulae:

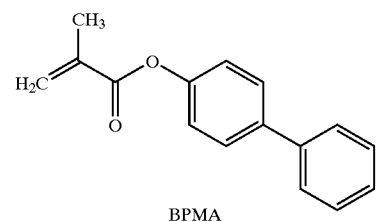

BPMA

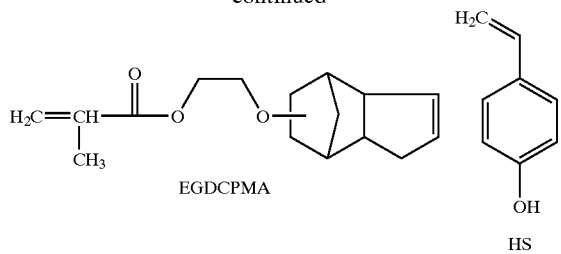

EGDCPMA

HS

In general the hydroxystyrene (HS) unit is provided by using the monomer acetoxystyrene (AcSt)

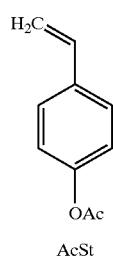

AcSt as the polymerization monomer in the polymerization reaction mixture and, after the polymerization reaction has taken place, diluting the reaction mixture with methanol and sodium methoxide in methanol (e.g., 10% solution) for methanolysis.

The phenolic OH functional group in PHS will be responsible for cross-linking reaction with a melamine or glycoluril type of cross-linker and the ethylene glycol group in EGDCPMA and phenolic functional group in PHS may promote solubility in the ester-solvents polyethylene glycol mono methyl ether acetate (PGMEA), ethyl lactate (EL), ethyl ethoxy propionate (EEP) and the like. The absorbance at 248-nm can be controlled through terpolymerization with acetoxystyrene by adjusting the ratio between biphenyl methacrylate, acetoxystyrene and the ethylene glycol functionalized monomers.

The thermally curable polymer composition comprises a hydroxyl-containing monomeric unit. Any suitable hydroxyl containing polymer may be used such as polymers comprising monomer units of hydroxystyrene, hydroxyalkyl acrylate or hydroxyalkyl methacrylate. Examples of suitable hydroxyalkyl acrylate or methacrylates monomer units are 2-hydroxyethyl acrylate or methacrylate, 3-hydroxypropyl acrylate or methacrylate, 4-hydroxybutyl acrylate or methacrylate, 5-hydroxypentyl acrylate or methacrylate, and 6-hydroxyhexyl acrylate or methacrylate and the like. Preferably, the hydroxyalkyl acrylate or methacrylate monomer units contains primary hydroxyl groups, although secondary and tertiary alcohol groups or mixtures of primary and secondary or primary, secondary and tertiary alcohol groups may be used. Suitable examples of secondary alcohols are 2-hydroxypropyl acrylate or methacrylate, 3-hydroxybutyl acrylate, 4-hydroxypentyl acrylate or methacrylate, 5-hydroxyhexyl acrylate or methacrylate, and the like. The preferred hydroxyalkyl acrylate or methacrylate is 2-hydroxyethyl acrylate or methacrylate.

The hydroxyl containing polymer should comprise aromatic monomer units to balance n & k of the resist, preferably biphenyl acrylate or methacrylate, naphthyl acrylate or methacrylate, and anthracenyl acrylate or methacrylate. In addition, the thermally curable polymer composition may also further comprise monomer units of ethylene glycol ester of acrylic or methacrylic acid to make more soluble polymer. Suitable example of monomer units, ethylene glycol methyl ether acrylate and methacrylates, ethylene glycol phenyl ether acrylates and methacrylates, diethylene glycol methyl ether acrylate and methacrylates and the like. Preferably, polymers comprising units of hydroxystyrene, biphenyl methacrylate and 2-(dicyclopenteneyloxy)ether acrylates and methacrylates have a number average molecular weight of about 8,000 to 40,000, more preferably 10,000 to 24,000.

Suitable solvents for the undercoat include ketones, ethers and esters, such as 2-heptanone, cyclohexanone, propylene glycol monoethyl ether acetate, propylene glycol methyl ether acetate, methyl lactate, ethyl lactate, methyl 3-methoxypropionate, N-methyl-2-pyrrolidone, ethylene glycol monoisopropyl ether, diethylene glycol monoethyl ether, diethylene glycol dimethyl ether and the like.

This invention relates to an EBR compatible thermally curable polymer composition, which may be used for forming an undercoat layer in deep UV lithography. The thermally curable polymer composition comprises a hydroxyl-containing polymer, an amino cross-linking agent and a thermal acid generator and solvent. When the composition is heated, the thermal acid generator generates an acid that protonates the polyfunctional amino cross-linking agent resulting in a very strong electrophilic group. This group reacts with a hydroxyl group on the hydroxyl-containing polymer forming a cured cross-linked polymer matrix.

Any suitable amino cross-linking agent may be used in the present application such as methylolated and/or methylolated and etherified melamines, methylolated and/or methylolated and etherified guanamines and the like. The preferred amino cross-linking agents have the general formula:

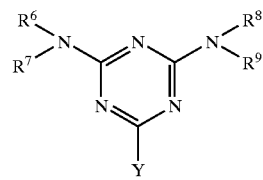

wherein Y is $NR^{10}R^{11}$ or a substituted or unsubstituted $C_6$–$C_{14}$ aryl or $C_1$–$C_8$ alkyl group; and $R^6$ to $R^1_1$ are independently a hydrogen or a group of the formula —$CH_2OH$ or —$CH_2O$ $R^{12}$ wherein $R^1$ is an alkyl group of about 1 to 8 carbons.

Examples of suitable melamine cross-linking agents are methoxyalkylmelamines such as hexamethoxymethylmelamine, trimethoxymethylmelamine, hexamethoxyethylmelamine, tetramethoxy-ethylmelamine, hexamethoxypropylmelamine, pentamethoxypropylmelamine, and the like. The preferred melamine cross-linking agent is hexamethoxymethylmelamine. Preferred aminocrosslinking agents are MW100LM melamine crosslinker from Sanwa Chemical Co. Ltd., Kanaxawa-ken, Japan, Cymel 303 and Powderlink from Cytec Industries, West Patterson, N.J.

The thermal acid generator of the present invention has the general formula:

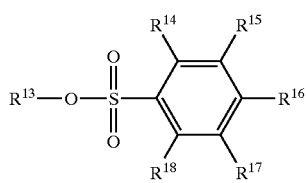

where $R^{13}$ is a substituted or unsubstituted alkyl, cycloalkyl or aromatic group wherein the substituted group is a halogen, alkoxy, aromatic, nitro or amino group; and $R^{14}$ to $R^{18}$ are independently selected from hydrogen, linear or branched $C_1$ to $C_4$ alkyl, alkoxy, amino, alkylamino, aryl, alkenyl, halogen, acyloxy, cycloalkyl, or annulated cycloalkyl, aromatic or heterocyclic. The preferred thermal acid generators are cyclohexyl p-toluenesulfonate, menthyl p-toluenesulfonate, bornyl p-toluenesulfonate, cyclohexyl triisopropylbenzenesulfonate, cyclohexyl 4-methoxybenzene sulfonate. More preferable thermal acid generators are cyclohexyl p-toluenesulfonate, menthyl p-toluenesulfonate and cyclohexyl 2,4,6-triisopropylbenzenesulfonate.

Annulated means that the cycloalkyl, aromatic or heterocyclic ring is connected onto the benzene ring of the thermal acid generator such as, for example, the annulated aromatic shown below

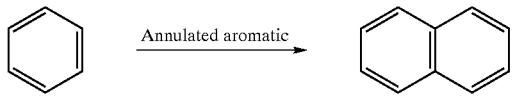

The thermal acid generators described above should not be considered photoacid generators. Any sensitivity that the thermal acid generators would have to UV light should be very poor, and they cannot practically be used in photolithography as a photoacid generator.

The thermally curable polymer composition preferably contains, on a total solids basis, about 75 to 95 wt. %, and more preferably about 82 to 95 wt. % of hydroxyl containing polymer. The amount of the amino cross-linking agent in the thermally curable polymer composition is preferably about 3 to 20 wt. % and more preferably about 3 to 6 wt. %. The amount of the thermal acid generator in the thermally curable polymer composition is preferably about 0.5 to 5 wt. % and more preferably about 2 to 4 wt. %.

The thermally curable polymer composition of the present invention should not begin significant cross-linking until it reaches a temperature of about 50° C. Significant cross-linking below 50° C. may lead to gel formation at room temperature, which will reduce its shelf life. Gel formation results in non-uniform coatings and line width variations across the substrate when the thermally curable polymer composition is used as an undercoat layer in microlithography.

The present invention also relates to a photolithographic coated substrate comprising: a substrate, a thermally cured undercoat composition on the substrate, and a radiation-sensitive resist topcoat on the thermally cured undercoat composition. The thermally cured undercoat composition comprises the thermally curable polymer composition that comprises a hydroxyl-containing polymer, an amino cross-linking agent and a thermal acid generator that has been heated to form a cross-linked matrix. Any of the polymers described above may be used as the hydroxyl-containing polymer.

The present invention further relates to a process for using the photolithographic coated substrate for the production of relief structures comprising the steps of: providing the photolithographic coated substrate, imagewise exposing the radiation-sensitive resist topcoat to actinic radiation; and forming a resist image by developing the radiation-sensitive resist topcoat with a developer to form open areas in the radiation-sensitive resist topcoat. In addition, the thermally cured undercoat composition may be removed in the open areas of the developed radiation-sensitive resist topcoat by any suitable process such as oxygen plasma etching to form an image in the thermally cured undercoat composition.

One advantage of the thermally curable polymer composition is that it may be cured at a temperature of less than about 250° C. and for a time less than about 180 seconds. This makes it particularly useful as an undercoat layer for a resist system where temperature and time constraints are important for commercial viability. Preferably, the thermally curable polymer composition is cured at temperatures between 150 to 250° C. and more preferably between temperatures of 180 to 220° C. The preferable cure times are from about 30 to 180 seconds and more preferably from about 60 to 120 seconds.

Both the undercoat and the radiation-sensitive compositions are uniformly applied to a substrate by known coating methods. The compositions are solubilized in an organic solvent and the coatings may be applied by spin-coating, dipping, knife coating, lamination, brushing, spraying, and reverse-roll coating. The coating thickness range generally covers values of about 0.1 to more than 10 μm and more preferably from about 0.1 to 1.5 um for the radiation-sensitive resist and about 0.3 to 3.0 um for the undercoat layer. After the coating operation, the solvent is generally removed by curing or drying.

Suitable solvents for both the undercoat and top radiation-sensitive compositions include ketones, ethers and esters, such as methyl ethyl ketone, methyl isobutyl ketone, 2-heptanone, cyclopentanone, cyclehexanone, 2-methoxy-1-propylene acetate, 2-methoxyethanol, 2-ethoxyethanol, 2-ethoxyethyl acetate, I-methoxy-2-propyl acetate, 1,2-dimethoxy ethane ethyl acetate, cellosolve acetate, propylene glycol monoethyl ether acetate, propylene glycol methyl ether acetate, methyl lactate, ethyl lactate, methyl pyruvate, ethyl pyruvate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. The solvents employed in the undercoat and top photoresist compositions will be chosen with a view toward their compatibility with the polymer resin in the undercoat and top photoresist compositions. For example, Thtchoice of solvent for the photoresist composition and the concentration thereof depends principally on the type of functionalities incorporated in the acid labile polymer, the photoacid generator, and the coating method. The solvent should be inert, should dissolve all the components in the photoresist, should not undergo any chemical reaction with the components and should be re-removable on drying after coating.

The radiation-sensitive resist topcoat of the present invention may be any suitable radiation-sensitive resist. It is typically a chemically amplified resist sensitive to radiation in the deep UV region such as those discussed in U.S. Pat. Nos. 5,492,793 and 5,747,622. Preferably, for a bilayer resist system, the radiation-sensitive resist will contain silicon to protect it from oxygen plasma etching.

The radiation-sensitive resist will also contain a photoacid generating (PAG) compound. The PAG compounds may be of any suitable type such as sulfonium or iodonium salts, nitrobenzyl esters, imidosulfonates esters and the like. Typically, the PAG will be present in an amount of about 1 to 10% based on the weight of the polymer.

Any suitable photoacid generator compounds may be used in the photoresist composition. The photoacid generator compounds are well known and include, for example, onium salts such as diazonium, sulfonium, sulfoxonium and iodonium salts, and disulfones. Suitable photoacid generator compounds are disclosed, for example, in U.S. Pat. Nos. 5,558,978 and 5,468,589 which are incorporated herein by reference.

Suitable examples of photoacid generators are phenacyl p-methylbenzenesulfonate, benzoin p-toluenesulfonate, α-(p-toluene-sulfonyloxy)methylbenzoin 3-(p-toluenesulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide.

Other suitable compounds are o-nitrobenzaldehydes which rearrange on actinic irradiation to give o-nitrosobenzoic acids such as 1-nitrobenzaldehyde and 2,6-nitrobenzaldehyde, α-haloacylphenones such as α,α,α-trichloroacetophenone and p-tert-butyl-α,α,α-trichloroacetophenone, and sulfonic esters of o-hydroxyacylphenones, such as 2-hydroxybenzophenone methanesulfonate and 2,4-hydroxybenzophenone bis (methanesulfonate).

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride and 4-hydroxy-2-methylphenylhexahydrothiopyrylium chloride.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

Other suitable examples of photogenerators are hexafluorotetrabromo-bisphenol A, 1,1,1-tris(3,5-dibromo-4-hydroxyphenyl)ethane and N-(2,4,6-tribromophenyl)-N'-(p-toluenesulfonyl)urea.

The photoacid generator compound is typically employed in the amounts of about 0.0001 to 20% by weight of polymer solids and more preferably about 1% to 10% by weight of polymer solids.

In an additional embodiment, base additives may be added to the photoresist composition. The purpose of the base additive is to scavenge protons present in the photoresist prior to being irradiated by the actinic radiation. The base prevents attack and cleavage of the acid labile groups by the undesirable acids, thereby increasing the performance and stability of the resist. The percentage of base in the composition should be significantly lower than the photoacid generator because it would not be desirable for the base to interfere with the cleavage of the acid labile groups after the photoresist composition is irradiated. The preferred range of the base compounds, when present, is about 3% to 50% by weight of the photoacid generator compound. Suitable examples of base additives are 2-methylimidazole, triisopropylamine, 4-dimethylaminopryidine, 4,4'-diaminodiphenyl ether, 2,4,5 triphenyl imidazole and 1,5-diazobicyclo[4.3.0]non-5-ene.

Dyes may be added to the photoresist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for photoresist compositions are described in U.S. Pat. No. 5,593,812.

The photoresist composition may further comprise conventional additives such as adhesion promoters and surfactants. A person skilled in the art will be able to choose the appropriate desired additive and its concentration.

The invention further relates to a process for forming a pattern on a substrate which comprises the following process steps: application of a photoresist coating comprising one of the compositions described above to the substrate; imagewise exposure of the coating to actinic radiation; treatment of the coating with an alkaline aqueous developer until the areas of the coating which have been exposed to the radiation dissolve from the substrate and an imaged photoresist structured coating remains on the substrate.

For the production of relief structures, the radiation-sensitive resist is imagewise exposed to actinic radiation. The term 'imagewise' exposure includes both exposure through a photomask containing a predetermined pattern, exposure by means of any suitable source of actinic radiation, such as for example, a computer controlled laser beam which is moved over the surface of the coated substrate, exposure by means of computer-controlled electron beams, and exposure by means of X-rays or UV rays, through a corresponding mask. The imagewise exposure generates acid in the exposed regions of the resist which cleaves the acid labile groups resulting in a polymer which is aqueous soluble. Typically, after imagewise exposure, the chemically amplified resist will be subjected to a post exposure heating treatment that virtually completes the reaction of the photoacid generator with the acid labile groups.

After imagewise exposure and any heat treatment of the material, the exposed areas of the top radiation-sensitive resist are typically removed by dissolution in a aqueous developer. The choice of the particular developer depends on the type of photoresist; in particular on the nature of the polymer resin or the photolysis products generated. The developer can comprise aqueous solutions of bases to which organic solvents or mixtures thereof may have been added.

Particularly preferred developers are aqueous alkaline solutions. These include, for example, aqueous solutions of alkali metal silicates, phosphates, hydroxides and carbonates, but in particular of tetra alkylammonium hydroxides, and more preferably tetramethylammonium hydroxide (TMAH). If desired, relatively small amounts of wetting agents and/or organic solvents can also be added to these solutions.

The radiation-sensitive resist used for the bilayer process described above will typically contain silicon or have silicon incorporated into the resist after development. After images are formed in the radiation-sensitive resist, the substrate will be placed in an plasma-etching environment comprising oxygen so that the underlayer coating will be removed in the area unprotected by the resist. The silicon incorporated in the radiation-sensitive resist forms silicon dioxide when exposed to an oxygen plasma and protects the resist from being etched so that relief structures can be formed in the undercoat layer.

After the oxygen plasma step, the substrate carrying the bilayer relief structure is generally subjected to at least one further treatment step which changes the substrate in areas not covered by the bilayer coating. Typically, this can be implantation of a dopant, deposition of another material on the substrate or an etching of the substrate. This is usually followed by the removal of the resist coating from the substrate typically by a fluorine/oxygen plasma etch.

The previously proposed copolymer comprising BPMA and HEMA is insoluble in most of the EBR compatible solvents and lithographic solvents such as PGMEA, EL and the like. The hydroxyl group of HEMA was used as the crosslinking functional group. In the preferred terpolymer of the present invention, namely a terpolymer comprising BPMA, AcSt (which further methanolysed to p-hydroxystyrene (HS)) and EGDCPMA, the BPMA unit in the polymer contributes towards optimizing the n & k value of the underlayer. The PHS unit in the polymer has two further roles in addition to its roles of absorbance and plasma etch resistance. It provides the functionality for crosslinking which is more effective than the hydroxy functionality in HEMA. Secondly the HS as its acetoxystyrene precursor copolymerizes randomly with BPMA, which changes the block nature of BPMA in microstructure of polymer and enhance the solubility of the polymer. The $3^{rd}$ monomer, an ester having at least one ether linkage, enhances solubility of polymer and increase etch resistant of polymer. The present polymer system is compatible to EBR solvents.

The present invention relates to a polymer composition comprising a thermally crosslinkable group which is highly soluble in all EBR compatible solvents. The present invention provides a thermally curable polymer composition, which is useful for an undercoat layer in deep UV lithography. This undercoat layer polymer can be cured at temperature less than about 220° C. and for a time less than about 2 minutes. This undercoat is insoluble to the top resist's solvent system and has an etch rate comparable to novolaks. The undercoat layer polymer composition of this invention has an index of refraction (n & k) tunable by composition that can be optimized to minimize reflection at the imaging layer/underlayer interface, and where scumming and footing can be completely eliminated by adjusting the amount of crosslinker in the formulation.

The invention is illustrated by, but not limited to, the following examples in which the parts and percentages are by weight unless otherwise specified.

A general synthetic procedure used for obtaining polymers of this invention by polymerization in tetrahydrofuran is as follows.

The mixture of monomers, initiator and chain transfer agent were are dissolved in 150 g THF under flow of $N_2$ in a round bottom flask equipped with a reflux condenser and a gas inlet. The mixture was heated to 65° C. with stirring and continued at the same temperature for 20 h under $N_2$. After that, the reaction mixture was cooled down to room temperature and an aliquot was taken for GPC. The reaction mixture was diluted with 60 ml methanol and sodium methoxide in methanol (10% solution) was added to it for methanolysis. The mixture was refluxed and the by-product methyl acetate was continuously removed by azeotropic distillation using Dean-Stark trap for 4 h. After cooling down to room temperature, 20 g Amberlyst 15 resin (ion exchange resin available from Rohm & Haas) was added to the mixture to ion exchange of sodium and stirred for 3 h. The resin was filtered and the solution was slowly poured into 4 L distilled water. The solid polymer was isolated by filtration and redissolved in 300 ml THF. The polymer was precipitated into 2 L isopropanol. After filtration, the solid was dried at 60° C. for 24 h under vacuum.

The general analytical procedures employed were as follows.

Molecular weights and molecular weight distributions were measured using a Waters Corp. liquid chromatograph (refractive index detection, Millennium (GPC V software), equipped with the following Phenogel-10, 7.8×250 mm columns: 10-4A, 500A & 50A (from Phenomena) and THF eluent. Thermal decomposition measurements (TGA) were performed using a Perkin-Elmer thermal gravimetric analyzer. The glass transition temperature (Tg) of the polymer was measured using Perkin-Elmer Pyris 1 Differential Scanning Calorimeter at a heating rate of 10° C./minute. The structure and composition of polymer was analyzed by $^{13}C$ NMR using a Bruker 400 MHz NMR-spectrometer.

POLYMER EXAMPLE 1

The mixture of monomers [4-biphenyl methacrylate (72.37 g, 0.303 mol), acetoxy styrene (10.56 g, 0.065 mol) and ethylene glycol dicyclopentenyl ether methacrylate (17.07 g, 0.065 mol)] and initiator VAZO 67 (6.00 g, 6.0 wt % vs monomers) and chain transfer agent 1-dodecanethiol (1.80 g, 30 wt % vs initiator) were polymerized according to the general procedure above. Transesterification employed 4.0 g sodium methoxide solution. Yield: 91.3 g, 94%. $M_w$=14,666; $M_w/M_n$=1.92. 5% weight loss at 310° C., Tg: 128° C. composition of polymers, mol %: 69% biphenyl methacrylate units; 16% hydroxystyrene units and 15% ethyleneglycol dicyclopentenyl ether methacrylate units.

POLYMER EXAMPLE 2

The mixture of monomers [4-biphenyl methacrylate (62.74 g, 0.263 mol), acetoxy styrene (14.23 g, 0.087 mol) and ethylene glycol dicyclopentenyl ether methacrylate (23.03 g, 0.087 mol)] and initiator VAZO 67 (6.00 g, 6.0 wt % vs monomers) and chain transfer agent 1-dodecanethiol (1.80 g, 30 wt % vs initiator) were polymerized according to the general procedure above. Transesterification employed 5.0 g sodium methoxide solution. Yield: 91.5 g, 95%. $M_w$=13,715; $M_w/M_n$=1.97. TGA: 5% weight loss at 305° C.; Tg: 124° C.; composition of polymers, mol %: 60% biphenyl methacrylate units; 19% hydroxystyrene units and 21% ethyleneglycol dicyclopentenyl ether methacrylate units.

POLYMER EXAMPLE 3

The mixture of monomers [4-biphenyl methacrylate (54.09 g, 0.227 mol), acetoxy styrene (22.09 g, 0.136 mol)

and ethylene glycol dicyclopentenyl ether methacrylate (23.82 g, 0.09 mol)] and initiator VAZO 67 (6.00 g, 6.0 wt % vs monomers) and chain transfer agent 1-dodecanethiol (1.80 g, 30 wt % vs initiator) were polymerized according to the general procedure above. Transesterification employed 6.0 g sodium methoxide solution. Yield: 85.5 g, 91%. $M_w$=11,262/1.88; $M_w/M_n$=1.88; TGA: 5% weight loss at 300° C.; Tg: 118° C. composition of polymers, mol %: 51% biphenyl methacrylate units; 28% hydroxystyrene units and 21% ethyleneglycol dicyclopentenyl ether methacrylate units.

POLYMER EXAMPLE 4

The mixture of monomers [biphenyl methacrylate [BPMA](37.74 g; 0.158 mol), acetoxy styrene (8.54 g; 0.0527 mol) and ethyleneglycol dicyclopentenyl ether methacrylate (13.82 g; 0.0527 mol) and chain transfer agent, 1-dodecanethiol (1.08 g, 30 wt % of initiator) were dissolved in 83.6 g of PGMEA (propylene glycol methyl ether acetate) (40% of solid) under flow of $N_2$ in a 500 mL, round bottom flask equipped with a reflux condenser and a gas inlet. The mixture was heated to 70° C. Then, VAZO 67® [free radical initiator, Dupont product, 2,2'-azobis(2-methylbutyronitrile)] (3.6 g, 6 wt % of monomer used) in 6.4 g of PGMEA was added slowly for 15 minutes to the reaction mixture and stirred for 24 h under $N_2$. The disappearance of BPMA was monitored by GPC using a UV detector at 254 nm. After 24 h, residual BPMA was <0.1%. The reaction mixture was cooled to room temperature. Then, 2.0 g of sodium methoxide in methanol (10 wt %) and 50 ml methanol were added to the flask. The reaction mixture was refluxed for 3 h and about 25 ml of methanol was removed by azeotropic distillation using a Dean-Stark trap. The solution was then cooled to room temperature and 10.0 g of Amberlyst 15 resin was added to it. The reaction mixture was stirred for 2 h and the resin was isolated by filtration. The solution was distilled to half of the volume under vacuum <60° C. to remove methanol and by-product, propylene glycol methyl ether. Finally, a 30 wt % of solid solution was made by adding PGMEA to it. $M_w$=15,700; $M_w/M_n$=1.95; and composition of polymers, mol %: 59% biphenyl methacrylate units; 20% hydroxystyrene units and 21% ethyleneglycol dicyclopentenyl ether methacrylate units.

POLYMER EXAMPLE 5

The mixture of monomers [biphenyl methacrylate [BPMA](37.74 g; 0.158 mol), acetoxy styrene (8.54 g; 0.0527 mol) and ethyleneglycol dicyclopentenyl ether methacrylate (13.82 g; 0.0527 mol) and chain transfer agent, 1-dodecanethiol (1.08 g, 30 wt % of initiator) were dissolved in 83.6 g of PGMEA (propylene glycol methyl ether acetate) (40% of solid) under flow of $N_2$ in a 500 mL, round bottom flask equipped with a reflux condenser and a gas inlet. The mixture was heated to 70° C. Then, VAZO 67® [free radical initiator, Dupont product, 2,2'-azobis(2-methylbutyronitrile)] (3.6 g, 6 wt % of monomer used) in 6.4 g of PGMEA was added slowly for 15 minutes to the reaction mixture. Then, the temperature was slowly increased to 80° C. and stirred for 4 h under $N_2$. The disappearance of BPMA was monitored by GPC using a UV detector at 254 nm. After 3 h, residual BPMA was <0.1%. The reaction mixture was cooled to room temperature. Then, 2.0 g of sodium methoxide in methanol (10 wt %) and 50 ml methanol were added to the flask. The reaction mixture was refluxed for 3 h and about 25 ml of methanol was removed by azeotropic distillation using a Dean-Stark trap. The solution was then cooled to room temperature and 10.0 g of Amberlyst 15 resin was added to it. The reaction mixture was stirred for 2 h and the resin was separated by filtration. The solution was distilled to half of the volume under vacuum <60° C. to remove methanol and by-product, propylene glycol methyl ether. Finally, a 30 wt % of solid solution was made by adding PGMEA to it. removed by azeotropic distillation using Dean-Stark trap. $M_w$=11,044; $M_w/M_n$=2.11 and composition of polymers, mol %: 60% biphenyl methacrylate units; 19% hydroxystyrene units and 21% ethyleneglycol dicyclopentenyl ether methacrylate units.

Undercoat formulations of the polymers of Examples 1 to 5 were formulated in the following examples.

Undercoat Formulation 1

For 100 g of undercoat solution (total 15 weight % solids), 14.02 g of Polymer of Example 1, 4.0 g MW100LM (Melamine crosslinker, Sanwa Chemical Co. Ltd., Kanaxawa-ken, Japan) solution (20 wt % solution in PGMEA) and 1.875 g of cyclohexyl tosylate thermal acid generator solution (20 wt % solution in PGMEA) were combined and dissolved in 80.1 g of propylene glycol methyl ether acetate (PGMEA). The mixture (polymer/crosslinker/TAG=93.5/4.0/2.5%) was rolled overnight, and the undercoat solution was filtered twice through a 0.1 μm Teflon filter.

Undercoat Formulation 2

For 100 g of undercoat solution (total 15 weight % solids), 14.02 g of Polymer of Example 2, 4.0 g MW100LM crosslinker solution (20 wt % solution in PGMEA) and 1.875 g of cyclohexyl tosylate thermal acid generator solution (20 wt % solution in PGMEA) were combined and dissolved in 80.1 g of propylene glycol methyl ether acetate (PGMEA). The mixture (polymer/crosslinker/TAG=93.5/4.0/2.5%) was rolled overnight, and the undercoat solution was filtered twice through a 0.1 μm Teflon filter.

Undercoat Formulation 3

For 100 g of undercoat solution (total 15 weight % solids), 14.02 g of Polymer of Example 3, 4.0 g MW100LM crosslinker solution (20 wt % solution in PGMEA) and 1.875 g of cyclohexyl tosylate thermal acid generator solution (20 wt % solution in PGMEA) were combined and dissolved in 80.1 g of propylene glycol methyl ether acetate (PGMEA). The mixture (polymer/crosslinker/TAG=93.5/4.0/2.5%) was rolled overnight, and the undercoat solution was filtered twice through a 0.1 μm Teflon filter.

Undercoat Formulation 4

For 100 g of undercoat solution (total 15 weight % solids), 46.75 g of Polymer of Example 4 solution, 4.0 g MW100LM crosslinker solution (20 wt % solution in PGMEA) and 1.875 g of cyclohexyl tosylate thermal acid generator solution (20 wt % solution in PGMEA) were combined and dissolved in 47.4 g of propylene glycol methyl ether acetate (PGMEA). The mixture (polymer/crosslinker/TAG=93.5/4.0/2.5%) was rolled overnight, and the undercoat solution was filtered twice through a 0.1 μm Teflon filter.

Undercoat Formulation 5

For 100 g of undercoat solution (total 15 weight % solids), 46.75 g of Polymer of Example 5 solution, 4.0 g MW100LM crosslinker solution (20 wt % solution in PGMEA) and 1.875 g of cyclohexyl tosylate thermal acid generator solution (20 wt % solution in PGMEA) were combined and dissolved in 47.4 g of propylene glycol methyl ether acetate (PGMEA). The mixture (polymer/crosslinker/TAG=93.5/4.0/2.5%) was rolled overnight, and the undercoat solution was filtered twice through a 0.1 μm Teflon filter.

Undercoat Formulation 6

For 100 g of undercoat solution (total 15 weight % solids), 14.33 g of Polymer of Example 1, 2.0 g MW100LM crosslinker solution (20 wt % solution in PGMEA) and 1.875 g of cyclohexyl tosylate thermal acid generator solution (20 wt % solution in PGMEA) were combined and dissolved in 81.8 g of propylene glycol methyl ether acetate (PGMEA). The mixture (polymer/crosslinker/TAG=95.5/2.0/2.5%) was rolled overnight, and the undercoat solution was filtered twice through a 0.1 μm Teflon filter.

Undercoat Formulation 7

For 100 g of undercoat solution (total 15 weight % solids), 14.18 g of Polymer of Example 1, 3.0 g MW100LM crosslinker solution (20 wt % solution in PGMEA) and 1.875 g of cyclohexyl tosylate thermal acid generator solution (20 wt % solution in PGMEA) were combined and dissolved in 81.0 g of propylene glycol methyl ether acetate (PGMEA). The mixture (polymer/crosslinker/TAG=94.5/3.0/2.5%) was rolled overnight, and the undercoat solution was filtered twice through a 0.1 μm Teflon filter.

Undercoat Formulation 8

For 100 g of undercoat solution (total 15 weight % solids), 13.83 g of Polymer of Example 1, 6.0 g MW100LM crosslinker solution (20 wt % solution in PGMEA) and 1.875 g of cyclohexyl tosylate thermal acid generator solution (20 wt % solution in PGMEA) were combined and dissolved in 78.4 g of propylene glycol methyl ether acetate (PGMEA). The mixture (polymer/crosslinker/TAG=91.5/6.0/2.5%) was rolled overnight, and the undercoat solution was filtered twice through a 0.1 μm Teflon filter.

Undercoat Formulation 9

For 100 g of undercoat solution (total 15 weight % solids), 13.13 g of Polymer of Example 1, 10.0 g MW100LM crosslinker solution (20 wt % solution in PGMEA) and 1.875 g of cyclohexyl tosylate thermal acid generator solution (20 wt % solution in PGMEA) were combined and dissolved in 75.0 g of propylene glycol methyl ether acetate (PGMEA). The mixture (polymer/crosslinker/TAG=87.5/10.0/2.5%) was rolled overnight, and the undercoat solution was filtered twice through a 0.1 μm Teflon filter.

Undercoat Formulation 10

For 100 g of undercoat solution (total 15 weight % solids), 14.02 g of Polymer of Example 1, 4.0 g Powderlink crosslinker solution (20 wt % solution in PGMEA) and 1.875 g of cyclohexyl tosylate thermal acid generator solution (20 wt % solution in PGMEA) were combined and dissolved in 80.1 g of propylene glycol methyl ether acetate (PGMEA). The mixture (polymer/crosslinker/TAG=93.5/4.0/2.5%) was rolled overnight, and the undercoat solution was filtered twice through a 0.1 μm Teflon filter.

Undercoat Formulation 11

For 100 g of undercoat solution (total 15 weight % solids), 14.10 g of Polymer: Example 1, 4.0 g MW100LM crosslinker solution (20 wt % solution in PGMEA) and 1.5 g of cyclohexyl tosylate thermal acid generator solution (20 wt % solution in PGMEA) were combined and dissolved in 80.4 g of propylene glycol methyl ether acetate (PGMEA). The mixture (polymer/crosslinker/TAG=94.0/4.0/2.0%) was rolled overnight, and the undercoat solution was filtered twice through a 0.1 μm Teflon filter.

Undercoat Formulation 12

For 100 g of undercoat solution (total 15 weight % solids), 13.95 g of Polymer of Example 1, 4.0 g MW100LM crosslinker solution (20 wt % solution in PGMEA) and 2.25 g of cyclohexyl tosylate thermal acid generator solution (20 wt % solution in PGMEA) were combined and dissolved in 79.8 g of propylene glycol methyl ether acetate (PGMEA). The mixture (polymer/crosslinker/TAG=93.0/4.0/3.0%) was rolled overnight, and the undercoat solution was filtered twice through a 0.1 μm Teflon filter.

Undercoat Formulation 13

For 100 g of undercoat solution (total 15 weight % solids), 13.80 g of Polymer of Example 1, 4.0 g MW100LM crosslinker solution (20 wt % solution in PGMEA) and 3.0 g of cyclohexyl tosylate thermal acid generator solution (20 wt % solution in PGMEA) were combined and dissolved in 79.2 g of propylene glycol methyl ether acetate (PGMEA). The mixture (polymer/crosslinker/TAG=93.0/4.0/4.0%) was rolled overnight, and the undercoat solution was filtered twice through a 0.1 μm Teflon filter.

Undercoat Formulation 14

For 100 g of undercoat solution (total 15 weight % solids), 13.65 g of Polymer of Example 1, 4.0 g MW100LM crosslinker solution (20 wt % solution in PGMEA) and 3.75 g of cyclohexyl tosylate thermal acid generator solution (20 wt % solution in PGMEA) were combined and dissolved in 78.6 g of propylene glycol methyl ether acetate (PGMEA). The mixture (polymer/crosslinker/TAG=91.0/4.0/5.0%) was rolled overnight, and the undercoat solution was filtered twice through a 0.1 μm Teflon filter.

The general procedure employed for lithographic testing the undercoat formulations was as follows.

A silicon wafer was spincoated with undercoat from an undercoat formulation and baked at 205° C. for 90 sec to yield a 0.50 μm thick film. The imaging layer (TIS 2000, a chemically amplified resist available from Arch Chemicals, Inc Norwalk, Conn.) was spincoated over the undercoat and baked at 135° C. for 1 min to yield a 0.25 μm thick film. The coated wafer was then patternwise exposed using an Ultratech 248 nm Stepper. The wafer was post exposure baked at 125° C. for 1 min and puddle developed for 60 sec in 0.262 N aqueous TMAH. The wafer was rinsed with DI water and spun dry. The patterns were analyzed by scanning electron microscopy (SEM). Images from SEM showed the bilayer resist could resolve features as small as 0.13 μm.

The general lithographic performance of the TIS-2000 compositions of this invention was:

photo speed range: 30 to 40 (mJ/cm$^2$);

resolution range: 0.120 to 0.130 (μm), and depth of focus: 0.70 to 1.0 (0.130μm features).

The results of the lithographic testing of the composition is set forth in the following Table 1.

TABLE 1

Summary of the Formulations and Image Quality Evaluation of the Undercoat Formulations.

| Example | Polymer | Polymer (grams) | Cross-linking Agent | Cross-linker (grams) 20 wt % solid | Termal acid Generator (grams) 20 wt % solid | PGMEA (grams) | Resolution Isolated lines (0.13 ? m), resist/undercoat (IL/UL) interface quality |
|---|---|---|---|---|---|---|---|
| 1 | Polymer | 14.02 | MW100 LM | 4.0 | 1.875 | 80.1 | No footing at IL/UL interface |
| 2 | Polymer 2 | 14.02 | MW100 LM | 4.0 | 1.875 | 80.1 | No Footing at IL/UL interface |
| 3 | Polymer 3 | 14.02 | MW100 LM | 4.0 | 1.875 | 80.1 | Scumming at IL/UL interface |
| 4 | Polymer 4 | 14.02 | MW100 LM | 4.0 | 1.875 | 80.1 | No Footing at IL/UL interface |
| 5 | Polymer 5 | 14.02 | MW100 LM | 4.0 | 1.875 | 80.1 | No Footing at IL/UL interface |
| 6 | Polymer 1 | 14.33 | MW100 LM | 2.0 | 1.875 | 81.8 | Collapsed line patterns |
| 7 | Polymer 1 | 14.18 | MW100 LM | 3.0 | 1.875 | 81.0 | Footing |
| 8 | Polymer 1 | 13.83 | MW100 LM | 6.0 | 1.875 | 78.4 | No Footing at IL/UL interface |
| 9 | Polymer 1 | 13.13 | MW100 LM | 10.0 | 1.875 | 75.0 | Footing |
| 10 | Polymer 1 | 14.02 | Powder link | 4.0 | 1.875 | 80.1 | No Footing at IL/UL interface |
| 11 | Polymer 1 | 14.10 | MW100 LM | 4.0 | 1.5 | 80.4 | No Footing at IL/UL interface |
| 12 | Polymer 1 | 13.95 | MW100 LM | 4.0 | 2.25 | 79.8 | No Footing at IL/UL interface |
| 13 | Polymer 1 | 13.80 | MW100 LM | 4.0 | 3.0 | 79.2 | No Footing at IL/UL interface |
| 14 | Polymer 1 | 13.65 | MW100 LM | 4.0 | 3.75 | 78.6 | T-topping |

SEM's result showed that there was scumming or foot at the resist/undercoat interface in the formulations with high cross-linking site (hydroxy styrene) polymer. Similarly, SEM'S result showed collapsed line patterns at low concentration of melamine crosslinker, perhaps due to insufficient curing of undercoat, which leads to intermixing at the resist/undercoat interface. Scum formation and footed profiles were observed at higher concentrations of crosslinker used in the formulations.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A thermally curable polymer composition comprising a hydroxyl-containing polymer, an amino cross-linking agent and a thermal acid generator, wherein the hydroxyl-containing polymer is a polymer comprising units m, n and o of the following formula:

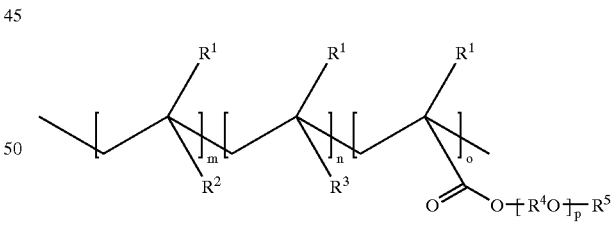

wherein $R^1$ is selected from the group consisting of H or methyl; $R^2$ is a univalent group such that the monomeric unit with the subscript m is selected from the group consisting of a substituted or unsubstituted $C_6$–$C_{14}$ aryl acrylate unit and $C_6$–$C_{14}$ aryl methacrylate unit wherein the substituted groups may be phenyl, $C_{1-4}$ alkyl or $C_{1-4}$ alkoxy; $R^3$ is a univalent group such that the monomeric unit with the subscript n is selected from the group consisting of hydroxyl functionalized $C_1$–$C_8$ alkyl acrylate, methacrylate and $C_6$–$C_{14}$ aryl unit, $R^4$ is a $C_1$–$C_{10}$ linear or branched alkylene; p is an integer of from 1 to 5 with the proviso that there are no more than thirty carbon atoms in the $[-R^4O-]_p$; $R^5$ is selected from the group consisting of $C_1$–$C_{10}$ linear, branched or cyclic alkyl, substituted or unsubstituted $C_6$–$C_{14}$ aryl, and substituted or unsubstituted $C_7$–$C_{15}$ alicyclic hydrocarbon; and m is about 40 to 70, n is about 15 to 35, and o is about 15 to 25.

2. A composition according to claim 1 wherein unit m is a biphenyl-acrylate or methacrylate unit and $R^5$ is dicyclopentenyl.

3. A composition according to claim 1 wherein unit n is a hydroxystyrene unit and $R^5$ is dicyclopentenyl.

4. A composition according to claim 3 wherein unit m is a biphenyl-acrylate or methacrylate unit; unit n is a hydroxystyrene unit; and unit o is an ethylene glycol dicyclopenteneyl- acrylate or methacrylate unit.

5. A composition according to claim 3 wherein the o unit is a n ethylene glycol dicyclopenteneyl methacrylate unit and the m unit is a biphenyl methacrylate unit.

6. A composition according to claim 1 wherein the hydroxyl-containing polymer has a molecular weight of from about 10,000 to about 24,000.

7. A photolithographic sensitive coated substrate comprising:
   (a) a substrate,
   (b) a thermally cured undercoat on said substrate, and
   (c) a radiation-sensitive resist topcoat on said undercoat,
   wherein said thermally cured undercoat comprises a thermally cured composition comprising a hydroxyl-containing polymer, an amino cross-linking agent and a thermal acid generator, and wherein the hydroxyl containing polymer is a polymer comprising units m, n and o of the following formula:

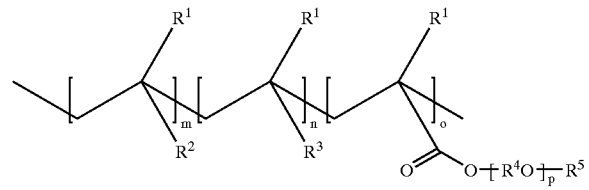

wherein $R^1$ is selected from the group consisting of H or methyl; $R^2$ is a univalent group such that the monomeric unit with the subscript m is selected from the group consisting of a substituted or unsubstituted $C_6$–$C_{14}$ aryl acrylate unit and $C_6$–$C_{14}$ aryl methacrylate unit wherein the substituted group groups may be phenyl, $C_{1-4}$ alkyl or $C_{1-4}$ alkoxy; $R^3$ is a univalent group such that the monomeric unit with the subscript n is selected from the group consisting of hydroxyl functionalized C1–C8 alkyl acrylate, methacrylate acid $C_6$–$C_{14}$ aryl unit, $R^4$ is a $C_1$–$C_{10}$ linear or branched alkylene; p is an integer of from 1 to 5 with the proviso that there are no more than thirty carbon atoms in the [—$R^4$O—]$_p$; $R^5$ is selected from the group consisting of $C_1$–$C_{10}$ linear, branched or cyclic alkyl, substituted or unsubstituted $C_6$–$C_{14}$ aryl, and substituted or unsubstituted $C_7$–$C_{15}$ alicyclic hydrocarbon; and m is about 40 to 70, n is about 15 to 35, and o is about 15 to 25.

8. A coated substrate according to claim 7 wherein unit m is a biphenyl-acrylate or methacrylate unit and $R^5$ is dicyclopentenyl.

9. A coated substrate according to claim 7 wherein unit n is a hydroxystyrene unit and $R^5$ is dicyclopentenyl.

10. A coated substrate according to claim 7 wherein unit m is a biphenyl-acrylate or methacrylate unit; unit n is a hydroxystyrene unit; and unit o is a ethylene glycol dicyclopenteneyl-acrylate or methacrylate unit.

11. A coated substrate according to claim 10 wherein the o unit is an ethylene glycol dicyclopenteneyl methacrylate unit and unit m is a biphenyl methacrylate unit.

12. A coated substrate according to claim 10 wherein the hydroxyl-containing polymer has a molecular weight of from about 10,000 to about 24, 000.

13. A process for the production of relief structures comprising the steps of:
   (a) forming a coated substrate wherein the coated substrate comprises
   (1) a substrate,
   (2) a thermally cured undercoat on said substrate, and
   (2) a radiation-sensitive resist topcoat on said undercoat,
   wherein said thermally cured undercoat comprises a thermally cured composition comprising a hydroxyl-containing polymer, an amino cross-linking agent and a thermal acid generator, and wherein the hydroxyl containing polymer is a polymer comprising units m, n and o of the following formula:

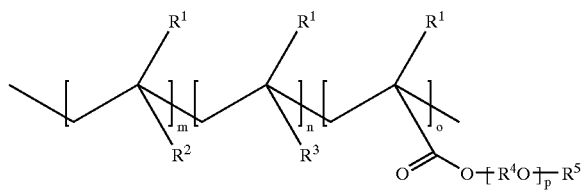

wherein $R^1$ is selected from the group consisting of H or methyl; $R^2$ is a univalent group such that the monomeric unit with the subscript m is selected from the group consisting of a substituted or unsubstituted $C_6$–$C_{14}$ aryl acrylate unit and $C_6$–$C_{14}$ aryl methacrylate unit wherein the substituted groups may be phenyl, $C_{1-4}$ alkyl or $C_{1-4}$ alkoxy; $R^3$ is a univalent group such that the monomeric unit with the subscript n is selected from the group consisting of hydroxyl functionalized $C_1$–$C_8$ alkyl acrylate, methacrylate and $C_6$–$C_{14}$ aryl unit, $R^4$ is a group containing an alicyclic ether moiety containing 6 or more carbon atoms $C_1$–$C_{10}$ linear or branched alkylene; p is an integer of from 1 to 5 with the proviso that there are no more than thirty carbon atoms in the [—$R^4$O—]$_p$; $R^5$ is selected from the group consisting of $C_1$–$C_{10}$ linear, branched or cyclic alkyl, substituted or unsubstituted $C_6$–$C_{14}$ aryl, and substituted or unsubstituted $C_7$–$C_{15}$ alicyclic hydrocarbon; and m is about 40 to 70, n is about 15 to 35, and o is about 15 to 25;

(b) imagewise exposing said radiation-sensitive topcoat to actinic radiation; and
   (c) forming a resist image by developing said radiation-sensitive topcoat with a developer.

14. A process according to claim 13 wherein unit m is a biphenyl-acrylate or methacrylate unit and $R^5$ is dicyclopentenyl.

15. A process according to claim 13 wherein unit n is a hydroxystyrene unit and $R^5$ is dicyclopentenyl.

16. A process according to claim 13 wherein unit m is a biphenyl-acrylate or methacrylate unit; unit n is a hydroxystyrene unit; and unit o is an ethylene glycol dicyclopenteneyl- acrylate or methacrylate unit.

17. A process according to claim 16 wherein the o unit is an ethylene glycol dicyclopenteneyl methacrylate unit and unit m is a biphenyl methacrylate unit.

18. A process according to claim 16 wherein the hydroxyl-containing polymer has a molecular weight of from about 10,000 to about 24,000.

* * * * *